United States Patent [19]
Weder

[11] Patent Number: 5,959,559
[45] Date of Patent: Sep. 28, 1999

[54] PARALLEL-TO-SERIAL CONVERTER

[75] Inventor: Uwe Weder, Au/Hallertau, Germany

[73] Assignee: Siemens Aktiengesellschaft, Munich, Germany

[21] Appl. No.: 08/990,147

[22] Filed: Dec. 12, 1997

[30] Foreign Application Priority Data

Dec. 13, 1996 [DE] Germany .......................... 196 52 003

[51] Int. Cl.⁶ .................................................. H03M 9/00
[52] U.S. Cl. .......................................... 341/101; 341/100
[58] Field of Search ..................................... 341/101, 100, 341/143, 95, 58, 59; 358/448; 340/825.01, 825.62; 395/559; 348/498, 451; 375/368, 354, 371

[56] References Cited

U.S. PATENT DOCUMENTS

| | | |
|---|---|---|
| 3,727,185 | 4/1973 | Jones et al. .......................... 340/825.62 |
| 5,197,070 | 3/1993 | Maeno . |
| 5,349,612 | 9/1994 | Guo et al. ................................ 375/371 |
| 5,349,653 | 9/1994 | Kurokawa et al. . |
| 5,541,596 | 7/1996 | Yoshida ................................... 341/100 |

FOREIGN PATENT DOCUMENTS

| | | |
|---|---|---|
| 0 576 150 | 12/1993 | European Pat. Off. . |
| 44 30 631 | 7/1995 | Germany . |

*Primary Examiner*—Michael Tokar
*Assistant Examiner*—Patrick Wamsley
*Attorney, Agent, or Firm*—Hill & Simpson

[57] ABSTRACT

A parallel-to-serial converter based on the principle of current evaluation that, in addition having signal paths, has a reference path with intentionally generated, poorer running time properties than all signal paths, and a conversion and a deactivation of a current source in an input hold element already occurring as soon as the reference path supplies a ready message. The advantages of this converter are particularly high signal processing speed and low dissipated power, but also low line crosstalk and small chip area. A further critical advantage is that the converter is adaptive in view of technology parameters, temperature and supply voltage, i.e. these quantities have nearly no influence on the functionability of the parallel-to-serial converter.

8 Claims, 4 Drawing Sheets

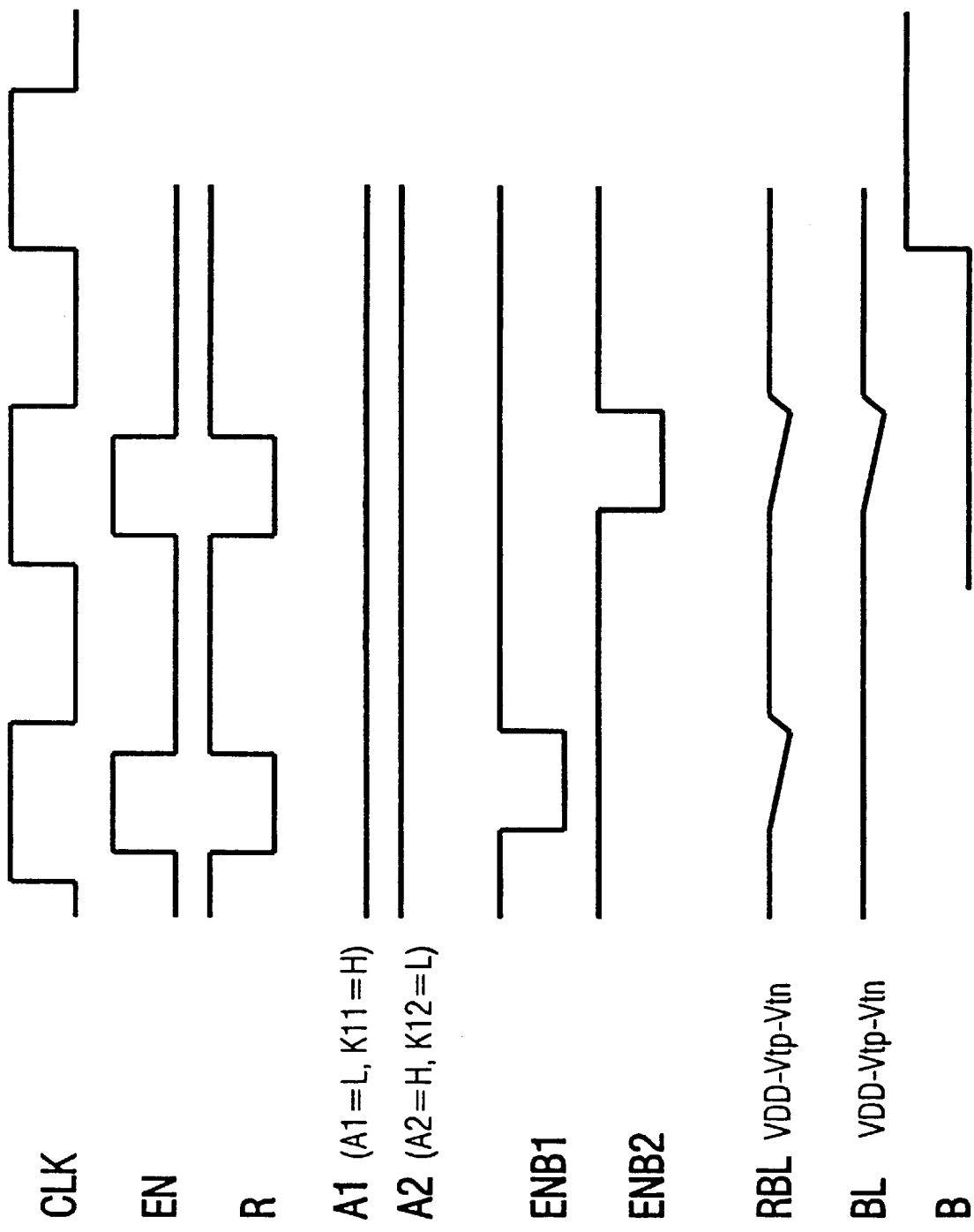

PARALLEL-TO-SERIAL CONVERTER

BACKGROUND OF THE INVENTION

The rapid development of semiconductor technology is characterized by permanently increasing clock rates given simultaneous enlargement of the chip area, of the number of gates, and of the dissipated power. In highly parallel bus systems, the task of transmitting signals very fast and with low dissipated power despite greater line lengths therefore occurs. In bus systems, the information on highly parallel bus lines are detected and evaluated in the form of voltage or current levels.

Levels are often transmitted with the full supply voltage swing in the voltage evaluation. A reduction of the dissipated power can be achieved by lowering the level; this, however, reduces the transmission speed. The voltage transmission given extremely long lines is becoming increasingly problematical with respect to the power consumption and the speed. Long lines with level changes on the order of magnitude of the supply voltage also cause very serious problems in view of line crosstalk. Although modified forms of voltage evaluation reduce the voltage swing and are characterized by a low dissipated power, they are very sensitive to capacitive inputs.

In evaluation of current, a current is transmitted and only a minimal voltage swing that approaches zero in the ideal case arises, as a result of which the line crosstalk is drastically reduced. Specifically given very long lines, this principle is also superior to the voltage evaluation with respect to the dissipated power and speed.

German Letters Patent DE 44 30 631 C1 discloses a circuit arrangement for power reduction in an integrated circuit wherein a bus line with a current evaluation circuit is provided.

SUMMARY OF THE INVENTION

An object of the invention is to specify a parallel-to-serial converter according to the current evaluation principle that, in addition to exhibiting a low line crosstalk of the bit lines and a low chip area, additionally particularly comprises a high signal processing speed and a low dissipated power and that is adaptive in view of technology parameters, temperature and supply voltage, i.e. that these quantities have nearly no influence on the functionability of the parallel-to-serial converter.

According to the present invention, a parallel-to-serial converter is provided having input hold elements respectively connected to parallel inputs at their respective input sides and connected to a signal bus line at their output side. A selection unit is provided which is clocked with a clock signal for individually activating the input hold elements. An evaluation unit is connected to the signal bus line at its input side and which at its output side connects to an output hold element which outputs a serial output signal. A reference hold element designed as a current source is activated simultaneously with one of the input hold elements every time and is connected at its output side to a reference evaluation unit via a reference bus line, the reference bus line always exhibiting a higher signal running time than a running time of the signal bus line. A control signal generating unit is connected at an input side to a ready message signal generated at an output of the reference evaluation unit and also to a clock signal. The control signal generator unit outputs an activation signal supplied to the output hold element as a transfer signal.

BRIEF DESCRIPTION OF THE DRAWINGS

FIG. 4 is a time diagram for explaining the functioning of the arrangements of FIG. 1, 2 and 3.

DESCRIPTION OF THE PREFERRED EMBODIMENTS

Figure 1:
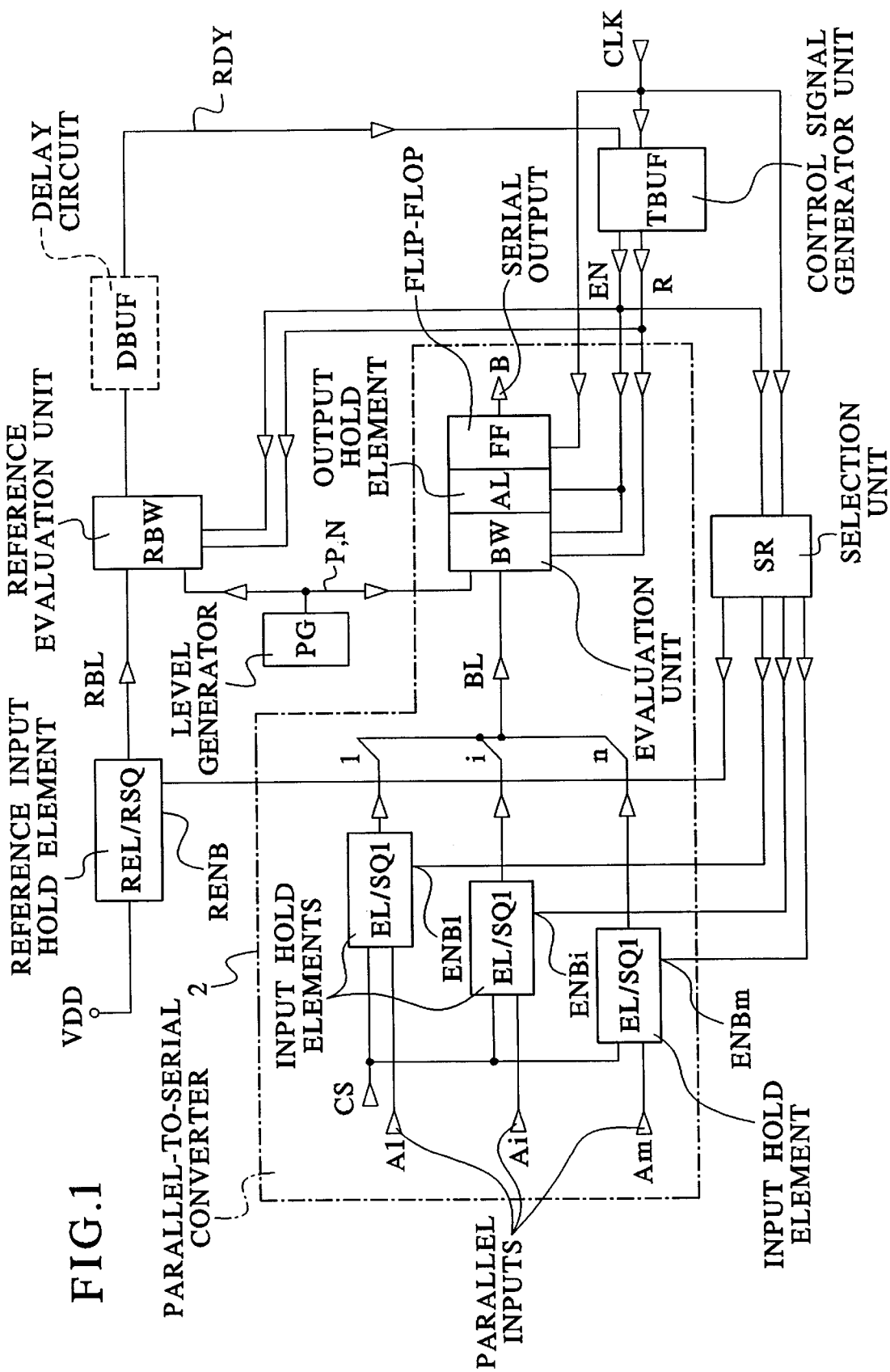
FIG. 1 is a schematic diagram of a parallel-to-serial converter.

FIG. 1 shows a parallel-to-serial converter of the invention that—by way of example—has a single signal path with a parallel-to-serial converter 2 according to the current evaluation principle and, beyond this, has a reference path that controls the signal path—recited by way of example— or a plurality of signal paths via a control signal generator unit TBUF, and a selection unit SR. Only a single bus line BL, which represents normally a plurality of bus lines, is shown in FIG. 1.

The reference path has an input hold element REL/RSQ implemented as a current source, a reference bus line RBL, and a reference evaluation unit RBW as well as, potentially, a delay circuit DBUF. Dependent on a ready message signal RDY and a clock signal CLK, the unit TBUF forms an activation signal EN and a reset signal R. The selection means SR is realized, for example, in the form of a shift register that is clocked by the clock signal CLK, and is activated at its input side with the activation signal EN.

The actual parallel-to-serial converter 2 of the signal path has input hold elements EL/SQ1 . . . EL/SQi . . . EL/SQm executed as current sources, whereby respectively one such hold element is connected to a respective parallel input A1 . . . Ai . . . Am and the outputs of the hold elements are connected to a 1-bit wide bus line BL. The hold elements EL/SQ1 . . . EL/SQi . . . EL/SQm comprise activation inputs ENB1 . . . ENBi . . . ENBm that can be driven via outputs of the selection unit SR, whereby an activation occurs here with the low status. The bus line BL has its end side connected to an evaluation unit BW that is driven by output signals P and N of a level generator PG. The evaluation unit BW is followed by an output hold element AL and the hold element A2 is in turn followed by a flip-flop FF for clock synchronization, whereby a serial output signal B is present at the output of the flip-flop FF. The evaluation unit BW can be activated by the signal EN and can be reset by the signal R. The output hold stage can likewise be activated by the signal EN, and the flip-flop FF is clocked by the clock signal CLK.

The reference input hold element REL/RSQ comprises an activation input RENB that is always activated by the selection unit SR when one of the input hold elements EL/SQ1 . . . EL/SQi . . . EL/SQm is activated. The reference evaluation unit RBW is constructed like the evaluation unit BW, is likewise connected to the level generator PG, and likewise receives the activation signal EN and the reset signal R.

The output signal of the reference evaluation unit RBW is connected to an input of the unit TBUF either directly or via a time delay unit DBUF and carries the ready message signal RDY. The delay unit DBUF delays by a plurality of gate running times, and serves the purpose of enhancing the data integrity.

The reference bus line RBL must exhibit a somewhat longer signal running time than the bus line BL of the signal path. This can be effected, for example, in that the reference bus line is longer than each of the bus lines BL, or that, for example, dummy lines connected to ground are placed at both sides next to the reference bus line RBL in the layout, the distance of these dummy lines from the reference line being smaller than that between two neighboring bit lines.

Advantageously, the reference bus line RBL and all bus lines BL can be conducted in a highest metal level given a three metal layer process, this exhibiting the comparatively lowest parasitic capacitance value and is usually processed to have a lowest-impedance. Moreover, bus lines in the highest metal level can be protected against charge interference due to lines that necessarily cross and carry a full voltage level. This occurs since these crossing lines are conducted in a first metal layer given simultaneous shielding by overlapping lines in a second metal level lying thereabove that are contacted with the supply voltage VDD.

Figure 2:
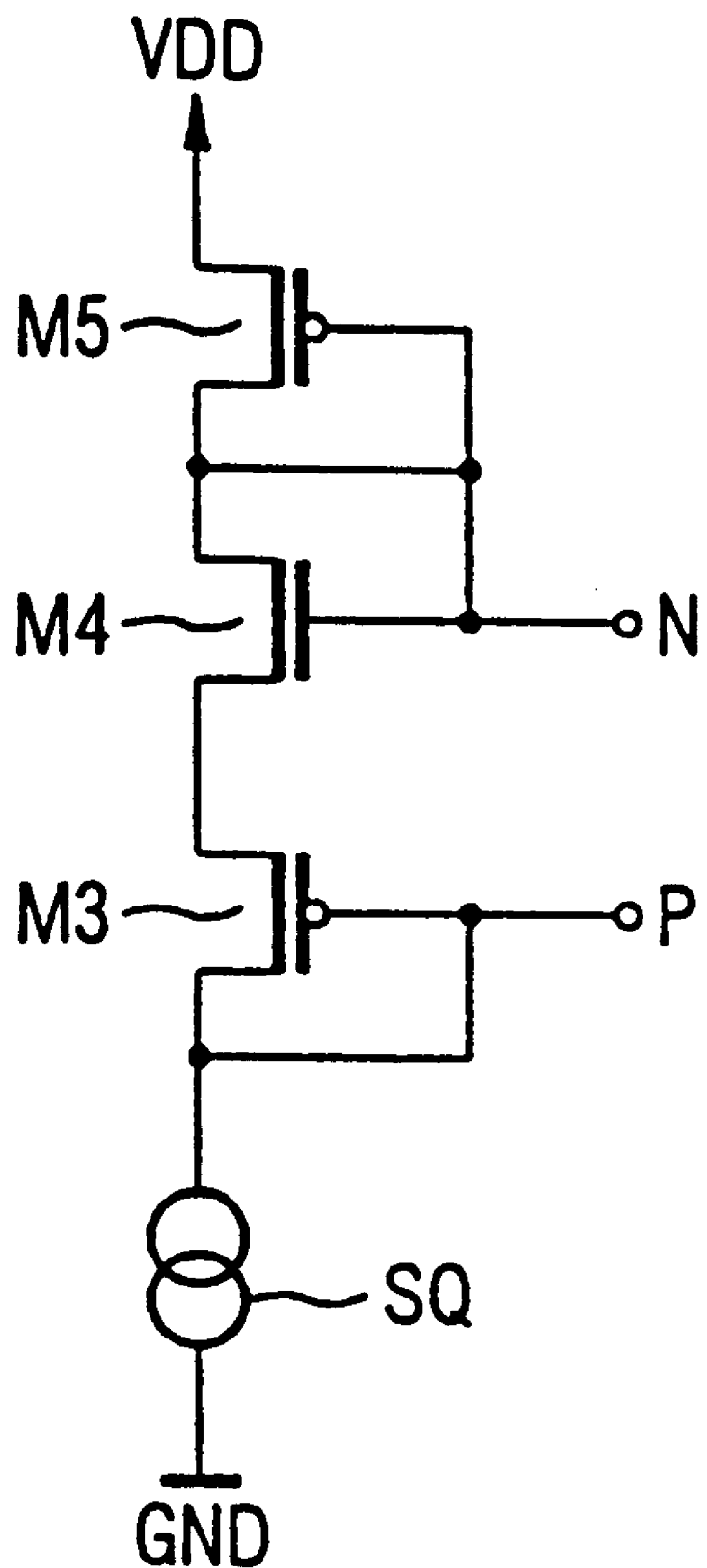
FIG. 2 is a detailed circuit diagram of a level generator of the converter of FIG. 1.
Figure 3:
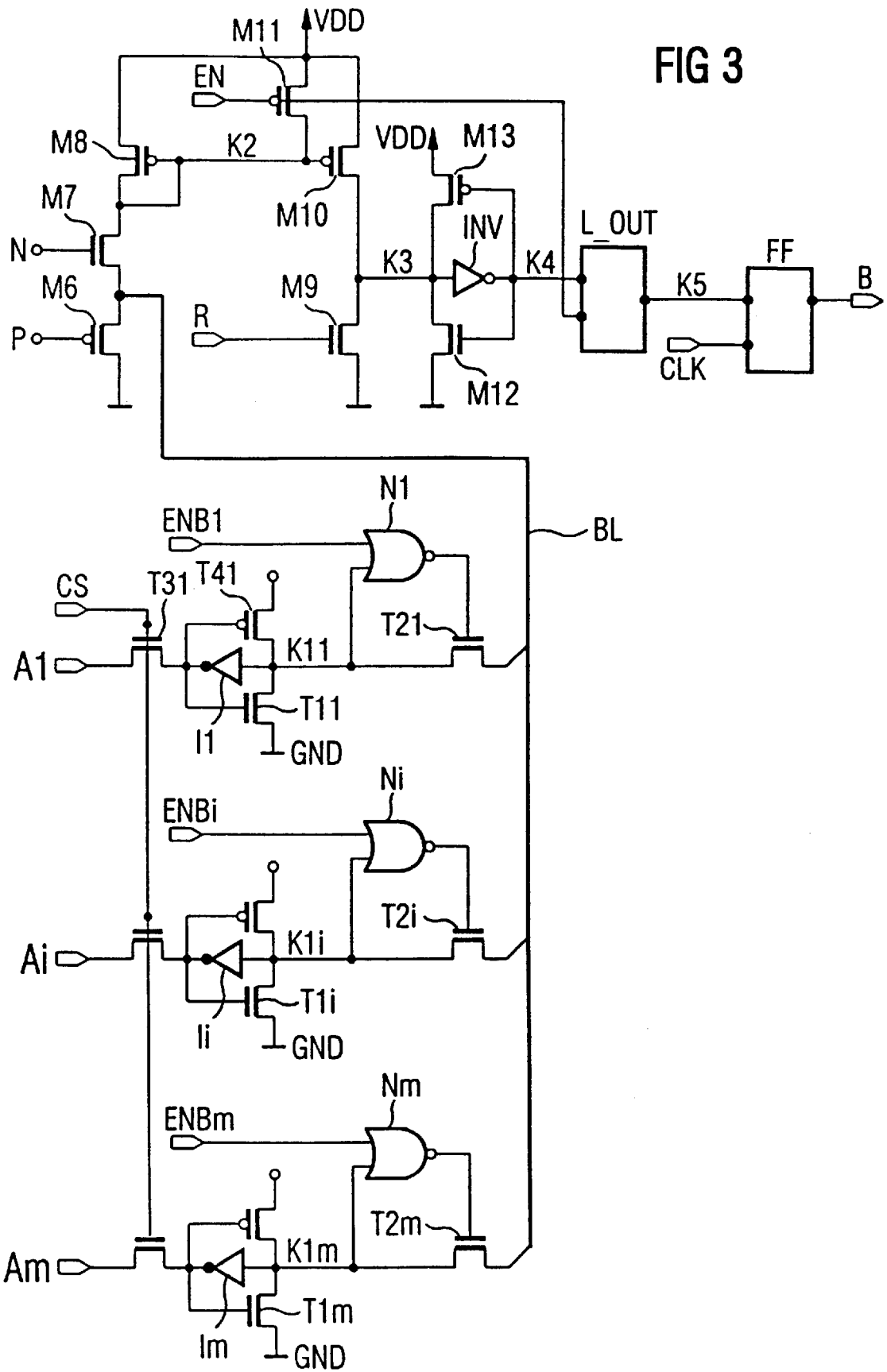
FIG. 3 is a detailed circuit diagram of a circuit portion of the converter of FIG. 1.

By way of example, FIG. 2 shows a level generator PG that has a current source SQ, a p-channel MOS transistor M3, an n-channel transistor M4 and a p-channel transistor M5. The current source SQ is connected at one side to ground potential GND and to the supply potential VDD via the sequence of series-connected transistors M3, M4 and M5. The gates of the transistors M4 and M5 are connected to the junction between the two transistors M4 and M5 via an output node N. and the gate of the transistor M3 is connected to the junction between the transistor M3 and the current source SQ via an output node FIG. 3 shows the actual parallel-to-serial converter 2 with a 1-bit wide bus line BI in greater detail by way of example. The input hold element EL/SQ1 designed as a current source thereby contains an NAND gate N1, an inverter I1 and transistors T11 ... T41, whereby the transistors T11 and T41 form an inverter that comprises an output node K11 and that is fedback by an inverter I1. Dependent on a selection signal CORRESPONDS, the parallel input A1 is thereby connectable via the transfer transistor T31 to an input of the inverter formed of the transistors T41 and T11. The output node K11 is thus connectable via a further transfer transistor T21 to the bus line BL, whereby the output of the NAND gate N1 is connected to the gate of the transfer transistor T21, and whereby a first input of the NAND gate N1 is connected to the activation input EN1 and a second input of the NAND gate is connected to the node K11. Together with the inverter formed of the transistors T41 and T11, the feedback by the inverter I1 thus forms a hold element that, dependent on the activation signal ENB1, is connectable at its output side to the bus line BL via the NAND gate N1 and the transfer transistor T21. The further input hold elements EL/SQ2 ... EL/SQi ... EL/SQm designed as a current source are correspondingly constructed like the input hold element EL/SQ1.

The evaluation unit BW shown in FIG. 3 comprises a p-channel MOS transistor M6, an n-channel transistor M7, a p-channel MOS transistor M8, an n-channel MOS transistor M9, a p-channel transistor M10 and a p-channel transistor M11. The transistors M6, M7 and M8 are connected in sequence between ground potential and the supply voltage VDD. The gate of the transistor M7 is connected to the output node N of the level generator PG, and the gate of the transistor M6 is connected to the output node P of the level generator. The two transistors M3 and M6 as well as M4 and M7 are connected as a current mirror, so that the same current which flows through the transistors M3 and M4 flows through the transistors M6 and M7, namely the current impressed by the current source SQ1. The transistors M3 ... M8 work in what is referred to as the strong inversion region, and a small, permanent quadrature axis current component thus flows. The gate of the transistor M8 and the gate of the transistor M10 are connected via a node K2 to the junction between the two transistors M7 and M8, as well as to the supply voltage VDD via the transistor M11. One terminal of the transistor M10 is connected to the supply voltage VDD, and the second terminal of the transistor M10 is connected via the node K3 to a first terminal of the transistor M9, a second terminal of which is connected to ground potential. The gate of the transistor M11 is driven by the activation signal EN, and the gate of the transistor M9 is driven by the reset signal R. The node K3 is connected to a node K4 via an inverter INV. The inverter INV is fedback via a weak inverter formed of an n-channel MOS transistor M12 and a p-channel MOS transistor M13. The current yield of the weak inverter is designed weaker than the inverter INV, and the latter switches into a different condition only beginning with a defined threshold of the input current intensity that differs from zero. The node K4 is connected to the input of the output hold stage L_OUT and can be throughconnected to a node K5 dependent on the activation signal EN. Here, the node KS is interconnected to an input of the flip-flop FF, whereby the flip-flop is clocked by the clock signal CLK and supplies the serial output signal B at its output.

The clock signal CLK (with a pulse-duty ratio of 1:1), the activation signal EN, the reset signal R, input signals A1 and A2, activation signals ENB1 and ENB2, the reference bus line signal RBL, the bus line signal BL and the serial output signal B are shown correlated in. time in FIG. 4. The parallel input A1 has a low potential, as a result of which the node K11 has a high potential, and the parallel input A2 has a high potential, as a result of which the node K12 lies at low potential. First, the first input hold element is activated by the activation signal ENB1, and the reference input hold element is activated by the activation signal RENB. A small voltage drop appears on the reference bus line, but not on the signal bus line BL since, due to A1, the bus line BL carries no current. Subsequently, the second input hold element is activated by the activation signal ENB2 and the reference input hold element is activated by the activation signal RENB. Both the reference bus line RBL as well as the signal bus line BL now exhibit a small voltage drop, since the input A2 exhibits a high potential and a current flows to ground potential GND via the bus line BL and the transistors T22 and T12. The second input signal is present as serial output signal B with the next clock pulse, and so forth.

At the beginning of an evaluation phase, the transistors Mg and M11 are inhibited, the node K3 lies at low potential, and the node K4 lies at high potential. The output hold element L_OUT is switched to transmission, as a result whereof the signal of the node K4 is connected inverted to the node K5, i.e. the node KS lies at low potential. With the assistance of the level generator circuit PG, the bus line is held at a potential of approximately VDD−Vtp−Vtn, whereby the voltage Vtp represents the threshold voltage of the p-channel MOS transistor M5, and the voltage Vtn represents the threshold voltage of the n-channel transistor M4. Corresponding to the potential at the node K1$i$ with the transistors T1$i$, T2$i$, a current is impressed or not impressed. A dynamic doubling of the capacitive crosstalk due to oppositely driven bus lines is avoided with this principle.

By contrast to the strong drivers required given voltage evaluation, the current source transistors T1$i$, T2$i$ can be designed approximately as minimal transistors , this drastically reducing the chip area because of the number of these elements. For the case K1$i$=H. no current is impressed and the evaluation unit remains in the initial condition. For the case K1$i$=L, the impressed current is mirrored via the transistor M8 to the transistor M10 and effects a tripping of the fedback inverter INV. By contrast to the circuit arrangement specified in Letters Patent DE 44 30 631 C1, the operating point of the bus line lies lower by the threshold voltage Vtp, as a result whereof the internal resistance of the evaluation unit and thus the voltage change on the bus line, are significantly reduced. The nearly complete acceptance of the impressed current by the transistor M8, precisely at the beginning of the evaluation phase, is even more decisive, the reaction time at the node K2 being drastically reduced as a result thereof. After the resetting by the reset signal R. the node K3 is initialized with low potential, and the node K4 is initialized with high potential. The mirror transistor M10 now over-drives the weak n-channel feedback transistor M12, this leading to that the node K3 assuming a high potential, and thus the node K4 assumes a low potential.

For speeding up the further signal processing, an output hold element L_OUT with an n-channel MOS transistor as a transfer transistor at the input (n-channel latch) is advantageously selected, this then forwarding the low potential possibly pending at the node K4 with only a very slight delay during the time-critical evaluation phase. The transfer transistor is thus similar to, for example, the transistor T31 in FIG. 3 that lies between the input A1 and the inverter I1 of the input hold element.

The termination of all current evaluation operations with the control signals R and EN thus occurs via the common reference evaluator unit RBW is constructed identical to the other evaluator units BW. Even taking differing running times on the bus lines into account, the termination dare only occur when the information at the node K5 is respectively stable.

As soon as the activation signal EN assumes a low potential, the information present at the node K4 is transferred into the output hold element L_OUT. Moreover, the node K2 is pulled approximately to the supply voltage VDD. The renewed initialization, proceeding from the node K3=low, is started with the reset signal R=high. What is critical is that the bus line is again brought exactly to the initial voltage in the shortest time. This is not possible given the circuit arrangement of Letters Patent DE 44 30 631 C1 since the corresponding transistors thereof work in what is referred to as the weak inversion region and, moreover, only switch into the inhibited condition very slowly by themselves. A drastic acceleration of the reset event is achieved by the transistor M11 and a small, permanent quadrature axis current component as a result of the transistors M6 . . . M8 working in what is referred to as the strong inversion region. Finally, the respective hold element EL/Sqi designed as current source is shut off via the respective current activation signal ENBi and the transistor T2$i$ with the high-low transition of the activation signal EN.

As a result of the described techniques, the evaluation and reset phase allow very high clock frequencies. Contrasting with the circuit arrangement disclosed by Letters Patent 44 030 631 C1, further the evaluation phase is not limited to half the period duration T/2, this in turn allowing even high clock frequencies to be prescribed. The current source transistors T1$i$ and T2$i$ supply a significant contribution to the dissipated power consumption of the overall circuit. The adaptive ending of the evaluation phase in view of the supply voltage, temperature, and technology parameters leads to an adaptive shut-off of the current source transistors T1$i$ and T2$i$. Finally, the independence of the current source activation from the frequency of the clock signal CLK also yields a significant reduction of the overall power consumption.

Bus lines BL or reference bus line RBL having, for example, a length of more than 6 mm, are required, if only because of the increasingly standard, long chip edge lengths of, for example, up to 15 mm.

In a realized integrated circuit, for example, 288 bus lines each having 16 input hold elements EL/SQ designed as current sources, i.e. a total of 4608 input hold elements EL/SQ designed as current sources, are provided. The maximum voltage swing on the bus lines thus amounts to only about 0.25 Volts. The realized integrated circuit contains a level generator PG, five reference paths with the units REL/RSQ, RBL, RBW and, potentially, DBUF, as well as the units TBUF and SR five-fold. This integrated circuit is operated with a clock signal that comprises a period duration of T=9.8 ns.

Although various minor changes and modifications might be proposed by those skilled in the art, it will be understood that my wish is to include within the claims of the patent warranted hereon all such changes and modifications as reasonably come within my contribution to the art.

I claim as my invention:

1. A parallel-to-serial converter, comprising:

input hold elements respectively connected to parallel inputs at their respective input sides and connected to a signal bus line at their output side, a selection unit being provided which is clocked with a clock signal for individually activating the input hold elements;

an evaluation unit connected to the signal bus line at its input side and which at its output side connects to an output hold element which outputs a serial output signal;

a reference input hold element designed as a current source which is activated by said selection unit simultaneously with one of the input hold elements every time and is connected at its output side to a reference evaluation unit via a reference bus line, the reference bus line always exhibiting a higher signal running time then a running time of the signal bus line; and a control signal generator unit connected at an input side to a ready message signal generated at an output of the reference evaluation unit and also to a clock signal for outputting an activation signal supplied to the output hold element as a transfer signal.

2. The parallel-to-serial converter according to claim 1 wherein the selection unit is supplied with the activation signal, the input hold elements are designed as current sources and are activated/deactivated at their output side dependent on the activation signal, and wherein an evaluation phase of the converter lasts longer than half a period duration of the clock signal.

3. The parallel-to-serial converter according to claim 1 wherein a transistor is provided in the evaluation unit between the signal bus line and ground potential and between the signal bus line and a supply voltage are driven such that they operate in a strong inversion region and a permanent quadrature access current component flows through said transistors.

4. The parallel-to-serial converter according to claim 1 wherein the bus line, with assistance of a level generator connected at an input to the evaluation unit, is held at a potential of approximately a supply voltage reduced by a threshold voltage of a p-channel transistor and reduced by a threshold voltage of an n-channel transistor.

5. The parallel-to-serial converter according to claim 1 wherein the evaluation unit and the reference evaluation unit have a transistor driven by the activation signal between a supply voltage and a gate of an n-channel MOS transistor connected to the supply voltage.

6. The parallel-to-serial converter according to claim 1 wherein the signal running time of the reference bus line is greater than a signal running time of the signal bus line since a length of the reference bus line is greater than a length of the signal bus line, and wherein two lines that carry ground potential and which cause additional line capacitance are additionally provided next to the reference bus line.

7. The parallel-to-serial converter according to claim 1 wherein the reference evaluation unit is additionally followed by the delay stage.

8. A parallel-to-serial converter, comprising:

input hold elements respectively connected to parallel inputs at their respective input sides and connected to a signal bus line at their output side, a selection unit being provided for individually activating the input hold elements;

an evaluation unit connected to the signal bus line at its input side and which at its output side connects to an output hold element which is connected to a serial output;

a reference input hold element which is activated by said selection unit when one of the input hold elements is activated and is connected at its output side to a reference evaluation unit via a reference bus line; and a control signal generator unit connected at an input side to a ready message signal generated at an output of the reference evaluation unit for outputting an activation signal supplied to the output hold element as a transfer signal.

* * * * *